(12) United States Patent
Mitsui (10) Patent No.: US 7,704,645 B2
(45) Date of Patent: Apr. 27, 2010

(54) METHOD OF GENERATING WRITING PATTERN DATA OF MASK AND METHOD OF WRITING MASK

(75) Inventor: Soichiro Mitsui, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1113 days.

(21) Appl. No.: 11/068,904

(22) Filed: Mar. 2, 2005

(65) Prior Publication Data

US 2005/0214657 A1    Sep. 29, 2005

(30) Foreign Application Priority Data

Mar. 24, 2004    (JP) .............................. 2004-087820

(51) Int. Cl.
G03F 1/00    (2006.01)
(52) U.S. Cl. .............................. 430/5; 716/19; 716/21
(58) Field of Classification Search .................... 430/5; 716/19, 21
See application file for complete search history.

(56) References Cited

U.S. PATENT DOCUMENTS

| | | | | |
|---|---|---|---|---|
| 6,229,871 | B1 | 5/2001 | Tichenor | |
| 6,233,044 | B1 * | 5/2001 | Brueck et al. | 355/67 |
| 6,883,158 | B1 * | 4/2005 | Sandstrom et al. | 716/19 |
| 7,147,975 | B2 * | 12/2006 | Misaka | 430/5 |
| 2001/0041297 | A1 * | 11/2001 | Nishi | 430/5 |
| 2003/0016338 | A1 * | 1/2003 | Yasuda et al. | 355/55 |
| 2003/0082460 | A1 * | 5/2003 | Stivers et al. | 430/5 |
| 2003/0208728 | A1 * | 11/2003 | Pierrat | 716/4 |
| 2003/0232257 | A1 * | 12/2003 | Inao et al. | 430/5 |

FOREIGN PATENT DOCUMENTS

JP    5-206017    8/1993

(Continued)

OTHER PUBLICATIONS

Meiling et al., "Reticle's Contribution to Critical Dimension Control and Overlay in Extreme-Ultraviolet Lithography", J. Vac. Sci. Technol., B 18(6), pp. 2921-2925, (2000).

(Continued)

Primary Examiner—Mark F Huff
Assistant Examiner—Rashid Alam
(74) Attorney, Agent, or Firm—FInnegan, Henderson, Farabow, Garrett & Dunner, L.L.P.

(57) ABSTRACT

A method of generating writing pattern data of a reflective mask for use in a non-telecentric exposure tool comprises obtaining a vertical position profile by measuring vertical positions of a plurality of X, Y coordinates arbitrarily set on the surface of a blank mask substrate when mounted on a mask stage, or by measuring and calculating a flatness profile, calculating unevenness of the blank mask substrate surface from the vertical position profile, calculating a shift amount of an image position, generated in a wafer mounted on a wafer stage of the exposure tool, in accordance with the unevenness of the blank mask substrate and parameters of a non-telecentric optics of the exposure tool, and obtaining corrected writing pattern data by correcting design pattern data of the reflective mask based on the shift amount of the image position and a reduction ratio of a projection optics of the exposure tool.

22 Claims, 6 Drawing Sheets

FOREIGN PATENT DOCUMENTS

| | | | |
|---|---|---|---|
| JP | 05241322 A * | 9/1993 | ............ 430/5 |
| JP | 6-177021 | 6/1994 | |
| JP | 11-045846 | 2/1999 | |
| JP | 11-219900 | 8/1999 | |
| JP | 2000-12445 | 1/2000 | |
| JP | 2003-45795 | 2/2003 | |
| JP | 2003-50458 | 2/2003 | |
| JP | 2003-297716 | 10/2003 | |
| JP | 2004-31954 | 1/2004 | |
| JP | 2004-214415 | 7/2004 | |

OTHER PUBLICATIONS

Notification of Reasons for Rejection issued by the Japanese Patent Office on May 29, 2007, for Japanese Patent Application No. 2004-087820, and English-language translation thereof.

Notification of Reasons for Rejection issued by the Japanese Patent Office on Mar. 4, 2008, for Japanese Patent Application No. 2004-087820, and English-language translation thereof.

Notification of Reasons for Rejection from Japanese Patent Office mailed Feb. 27, 2007, in Japanese Application No. 2004-087820, and English translation thereof.

* cited by examiner

METHOD OF GENERATING WRITING PATTERN DATA OF MASK AND METHOD OF WRITING MASK

CROSS-REFERENCE TO RELATED APPLICATIONS

This application is based upon and claims the benefit of priority from prior Japanese Patent Application No. 2004-087820, filed Mar. 24, 2004, the entire contents of which are incorporated herein by reference.

BACKGROUND OF THE INVENTION

1. Field of the Invention

The present invention relates to a writing technique of a mask using an electron beam or laser beam, particularly to a method of generating writing pattern data of a mask for use in an extreme ultraviolet (EUV) lithography technique utilizing soft X-rays, and a method of writing a mask.

2. Description of the Related Art

In recent years, as the next-generation lithography technique, an EUV lithography technique involving a reduced reflective-type projection exposure technique using 5- to 15-nm soft X-rays has been developed on a worldwide scale. In this lithography, since there is no substance (material) suitable for a refractive optical element in an EUV light region, a mask, illumination optics, and projection optics are all constituted of reflective types. An Mo/Si multilayered film indicating a high reflectance with respect to EUV light is formed on the mask, and a Cr— or Ta-based absorber with respect to the EUV light is used in an opaque material. Similarly, the Mo/Si multilayered film is formed on a reflective mirror which is an optical element of reflective optics.

The use of a system similar to a so-called optical scanner in an EUV exposure tool is planned, illuminative light having an annular shape is applied to the mask in an oblique direction at an angle of incidence around 6°, the mask and a substrate (wafer) to be exposed are scanned relatively with respect to the projection optics at a speed ratio in accordance with the reduction ratio, and reflective light from the mask surface on which a mask pattern is formed is projected/reduced to thereby form a mask pattern into a film on the wafer.

In the projection optics of the reflective type exposure system, since a non-telecentric system is constituted on a mask side, image shift of the projected/reduced pattern on the wafer, which is in-plane displacement, is a problem. A position where the pattern is formed into an image shifts in a horizontal plane of the wafer because of unevenness of the mask surface.

For example, when a vertical position of the mask in a portion where a certain pattern is formed displaces from a reference plane by 0.1 μm, a projection image forming position shifts from an original image forming position by about 2.6 nm on the wafer. In the same manner as in a usual photomask, a positional shift by elastic deformation of the mask also raises a problem. The positional shift of the pattern is caused by the weight of the mask, stresses of various thin films formed on the mask (multilayered film, absorber, buffer, etc.), temperature, and holding. Since a film structure of the EUV mask is complicated, there is a possibility that the pattern positional shift by in-plane stress non-uniformity of the film raises a problem.

Displacement of the mask plane (or height) in the Z-direction (vertical direction), which is a cause for the image shift, is caused not only by an uneven shape (e.g., uneven surface) of the mask but also flatness of a mask holding mechanism (mask chuck). This also applies to unevenness of the wafer, or flatness of the wafer chuck. Furthermore, mechanical fluctuation in the Z-direction in driving the mask or a wafer stage is also a cause. Thus, since the image shift is attributed to a mask front surface shape at exposure, and does not indicate a constant value, it is difficult to control the shift by the exposure tool. However, the above-described image forming position shift of the mask pattern is minimized in a possible range, and transfer position precision needs to be secured. For this purpose, the distance between points in at least a plane between the mask and the wafer is kept constant, and exposure is performed. In a conventional exposure technique, for securement of a depth of focus (DOF) and suppression of magnification error, postures of the mask and the wafer are usually controlled by Z-axis driving mechanisms and tilt mechanisms to hold constant distances based on the result of measurement of both vertical positions using focus sensors, respectively. For example, as a method of correcting the image shift at the exposure to thereby perform exposure, in Jpn. Pat. Appln. KOKAI Publication No. 11-219900, it has been proposed that while adjusting relative positions in the Z-direction, the mask and the wafer stage should be moved synchronously in reverse along the Y-direction to thereby suppress the positional shift attributed to Z-displacement of the mask. In U.S. Pat. No. 6,229,871, it has been proposed that unevenness should be disposed on a non-planar chuck surface, and an easily bendable mask should be chucked. Accordingly, the relative positions in the Z-direction are easily driven/controlled to thereby correct in-plane positional shift in the scanning direction.

However, since the vertical position of the mask or the wafer monitored by the focus sensor indicates a value in a local position, the distance between the mask and wafer is simply controlled to be constant based on the average vertical position in an irradiation region plane even in a full field exposure tool or a scanner exposure tool. Since there is necessarily local unevenness in the irradiation region plane of a finite region, not all vertical positions in the irradiation region plane take constant values. Therefore, even when the distance between the mask and the wafer surface is controlled to be constant based on the average vertical position in the irradiation region plane, image shifts are produced in individual patterns in accordance with the local unevenness included in the irradiation region plane, and therefore positional precision is deteriorated.

As described above, there has been a problem that a transfer pattern cannot be obtained with sufficient positional precision in a non-telecentric exposure system represented by the EUV lithography technique. Therefore, there has been a demand for realization of a method of generating writing pattern data capable of obtaining a transfer pattern with the necessary positional precision, and a method of writing a mask in a non-telecentric exposure system using a reflective mask.

BRIEF SUMMARY OF THE INVENTION

According to a first aspect of the invention, there is provided a method of generating writing pattern data of a reflective mask for use in a non-telecentric exposure tool, which comprises:

obtaining a vertical position profile by measuring vertical positions of a plurality of X, Y coordinates arbitrarily set on the surface of a blank mask substrate when mounted on a mask stage of the exposure tool, or by measuring and calculating a flatness profile of the surface of the blank mask;

calculating unevenness of the blank mask substrate surface from the vertical position profile;

calculating a shift amount of an image position which is transferred by the exposure tool, generated in a wafer substrate to be processed, mounted on a wafer stage of the exposure tool, in accordance with the unevenness of the blank mask substrate and parameters of a non-telecentric optics of the exposure tool; and obtaining first corrected writing pattern data by correcting design pattern data of the reflective mask based on the shift amount of the image position and a reduction ratio of a projection optics of the exposure tool.

According to a second aspect of the invention, there is provided a method of generating writing pattern data of a reflective mask for use in a non-telecentric exposure tool, which comprises:

obtaining a vertical position profile by measuring or calculating vertical positions of a plurality of X, Y coordinates arbitrarily set on a surface of a blank mask substrate when mounted on a mask stage of the exposure tool;

calculating unevenness and local surface gradient of the blank mask substrate surface from the vertical position profile;

calculating a shift amount of an image position which is transferred by the exposure tool, generated in a wafer substrate to be processed, mounted on a wafer stage of the exposure tool, in accordance with the unevenness and the gradient of the blank mask substrate and parameters of a non-telecentric optics of the exposure tool; and obtaining first corrected writing pattern data by correcting design pattern data of the reflective mask based on the shift amount of the image position and a reduction ratio of projection optics of the exposure tool.

DETAILED DESCRIPTION OF THE INVENTION

According to embodiments of the present invention described below, unevenness or local curved surface tilt of a mask when mounted on an exposure tool, and image forming position shift and direction on a wafer, caused by a non-telecentric exposure system, are corrected, and accordingly there can be provided a mask for reflective exposure capable of realizing a necessary transfer position precision. The embodiments of the present invention will be described hereinafter with reference to the drawings.

First Embodiment

Figure 1:
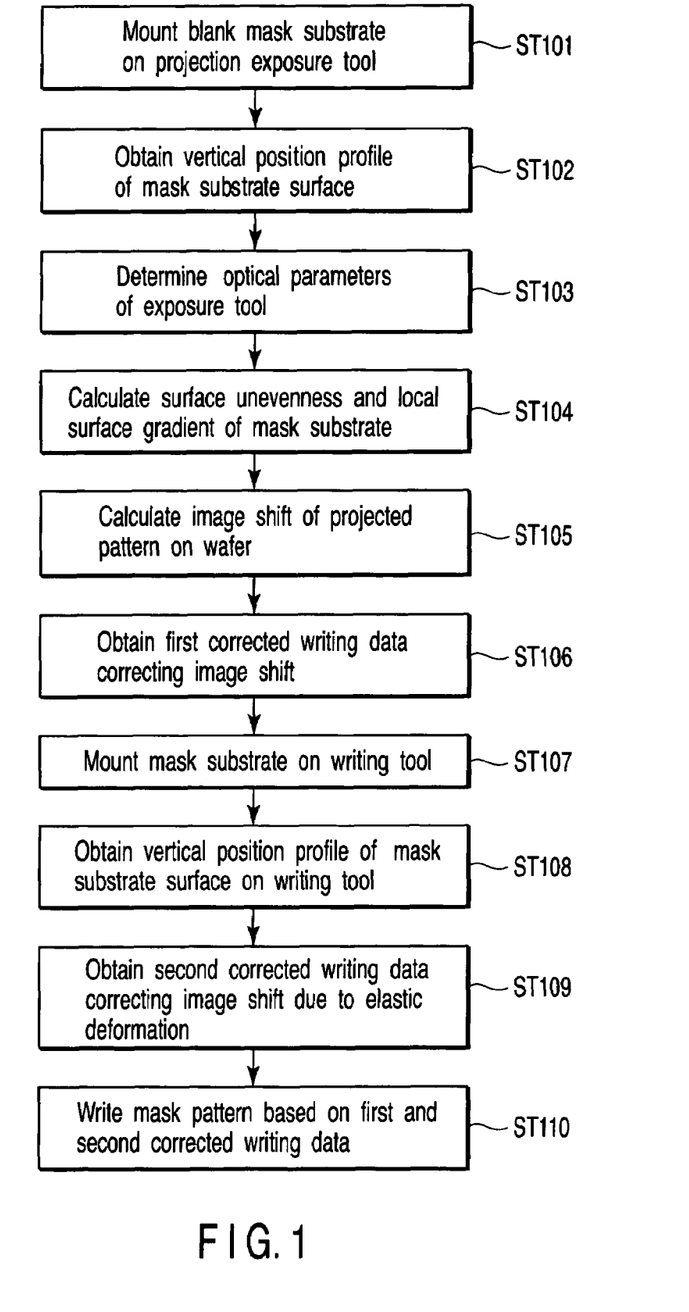
FIG. 1 is a flowchart showing a writing method according to a first embodiment.

FIG. 1 is a flowchart showing a writing method according to a first embodiment of the present invention, and shows an outline of the present invention.

Figure 2:
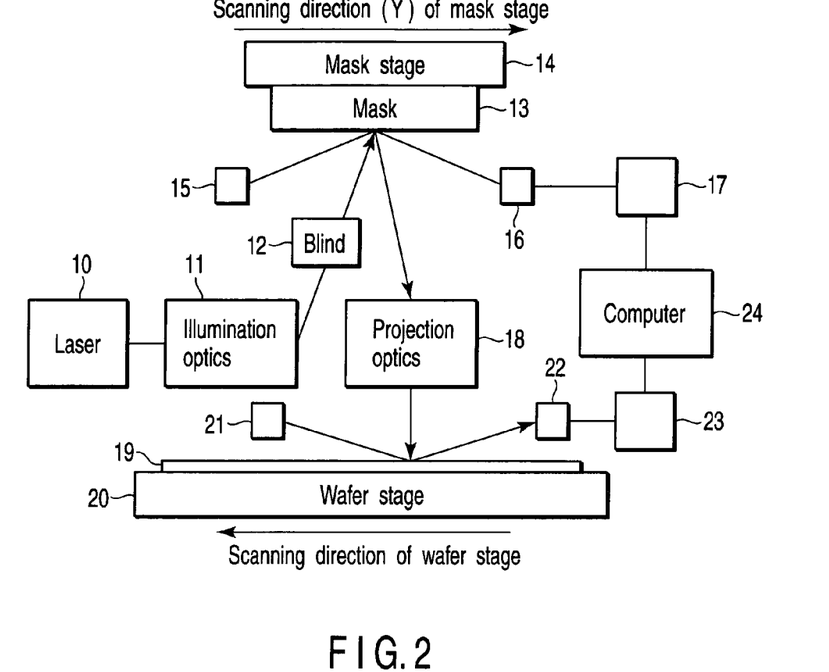
FIG. 2 is a diagram showing a constitution of a non-telecentric optical exposure tool according to the first embodiment.

First, a blank mask substrate is mounted on a non-telecentric optical exposure tool for actual use (step ST101). A constitution of the non-telecentric optical exposure tool for actual use is illustrated in FIG. 2. In more detail, light of an EUV region is selected and emitted from a wavelength band of the light generated by a laser light source 10, and illuminative light is formed through an illumination optics 11 and a blind 12. An irradiation range 30 of the illuminative light has a substantially annular shape as shown in a schematic diagram of FIG. 3, and the light strikes on a mask substrate 13 at an angle of incidence of 6°. Reference numeral 31 denotes a fiducial mark. Next, the light which has illuminated the mask substrate 13 is reflected by the surface of the mask substrate 13, passes through projection optics 18, and is reduced/projected in a predetermined region of a wafer (wafer substrate) 19. In this case, the mask is relatively scanned with respect to the projection optics at a speed four times that on a wafer side, and a mask pattern is formed into an image on the wafer at a reduction ratio of 1/4. It is to be noted that, needless to say, the mask substrate 13 or the wafer 19 which is a substrate to be exposed is conveyed beforehand and set based on a predetermined process, and an alignment operation, vertical position measurement or the like is performed. The vertical position of the wafer is measured by vertical position sensors 21, 22, and a vertical position measuring system 23 in the same manner as in the mask side, and data is processed by an arithmetical circuit (computer) 24. In scanning exposure, Z and tilt components of a wafer stage are controlled in such a manner that a focal distance indicates a predetermined value based on vertical position data results of the computer 24, and exposure by a so-called dynamic focus operation is executed.

Next, the blank mask substrate 13 is conveyed, held, and positioned on a mask stage 14 in such a manner that a state is the same as that for use in an actual exposure step. Needless to say, no circuit pattern is formed on the blank mask substrate 13.

Next, a vertical position profile of the mask substrate when mounted on a non-telecentric exposure tool is obtained (step ST102). A surface vertical position of the blank mask substrate 13 is measured through mask vertical position sensors 15, 16, and a vertical position measuring system 17. Here, a relative vertical position shift from a reference vertical position disposed in the exposure tool is measured. From results of the vertical position shift measurement, the vertical position and tilt components of the mask stage 14 are adjusted in such a manner that a held posture of the blank mask substrate 13 is brought into a predetermined relation in the exposure tool, and the substrate is maintained in a held state similar to the posture at exposure.

In the adjusted state, the vertical position of the mask is measured again, a mask stage 14 is driven along grid, and measurement is performed with respect to points of the grid. For example, the measurement grid is set to 11×13 points at an interval of 10 mm, and the measurement is performed with respect to right/left upper/lower grid points around a mask substrate middle which is an original point in a sequence. This has been set assuming that an exposure field size is 26 mm×33 mm, exposure magnification is four times, and remarkably little level unevenness which raises a problem in a characteristic of a polishing process of the blank mask is produced in a high-frequency region from an unevenness period of 10 mm.

It is to be noted that the profile measurement of the substrate surface in the vertical direction does not have to be necessarily performed in X, Y grids (discrete grid points). A plurality of X, Y coordinates may be arbitrarily set to obtain the vertical direction profile so as to measure the vertical positions of the plurality of X, Y coordinates. Instead, surface data such as interference fringes are obtained, and displacements of the vertical direction in predetermined X, Y grid positions may be extracted from the interference fringe data, obtained, and used.

Figure 4:
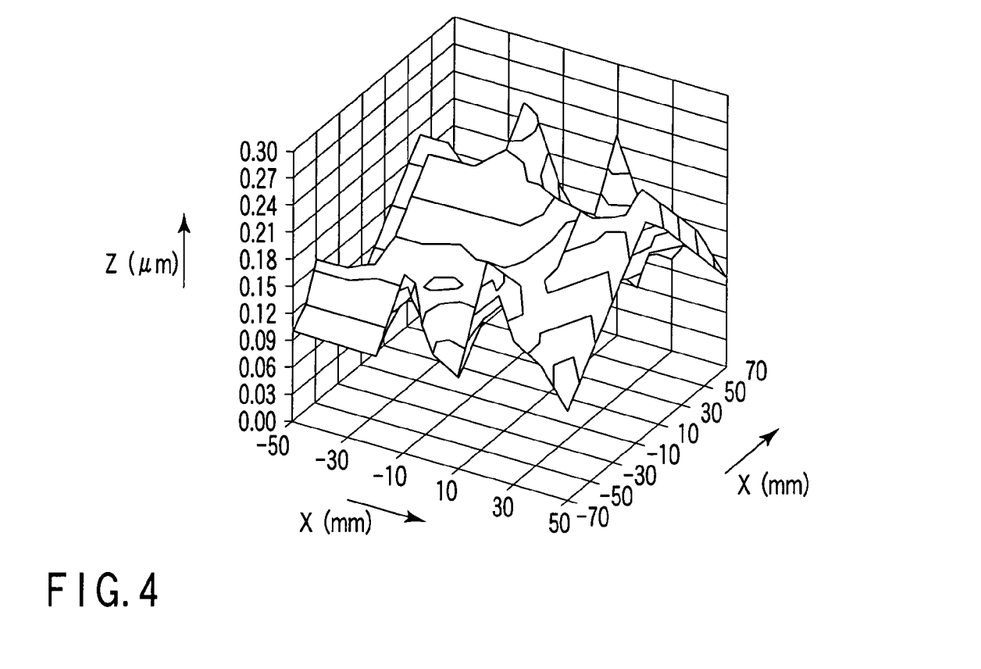
FIG. 4 is a diagram showing a vertical position distribution of a mask substrate surface.

An example of the vertical position profile of the mask substrate surface, measured in this sequence, is shown in FIG. 4. As viewed from a reference vertical position of the exposure tool, the present mask substrate is higher by 0.18 μm on average. It is to be noted that a direction in which the surface becomes high means a direction in which the mask surface approaches the projection optics.

Next, numeric values are set to thereby determine exposure parameters of the exposure tool in the arithmetical circuit (step ST103). Here, the exposure parameters include angle of incidence and direction of incidence of exposure light upon the mask, scanning direction of the exposure light with respect to the mask (scanning direction of the wafer with respect to the mask substrate), and reduction ratio (exposure magnification). These parameters can also be set by designating a tool number (i.e., ID, or serial number) of the exposure tool which is used. In the present embodiment, the angle of incidence is 6°, and the scanning direction agrees with a +Y direction of mask coordinate. The reduction ratio of the projection optics is 1/4.

Next, surface unevenness, and, if necessary, local curved surface gradient of the mask substrate are calculated from vertical position data of the mask substrate surface obtained in the step ST102 (step ST104).

Next, image shift of the pattern with which the mask pattern is projected to the wafer and formed is calculated (step ST105). The image shift peculiar to the non-telecentric system will be described hereinafter. All of them are factors for drop in position precision.

Figure 5:
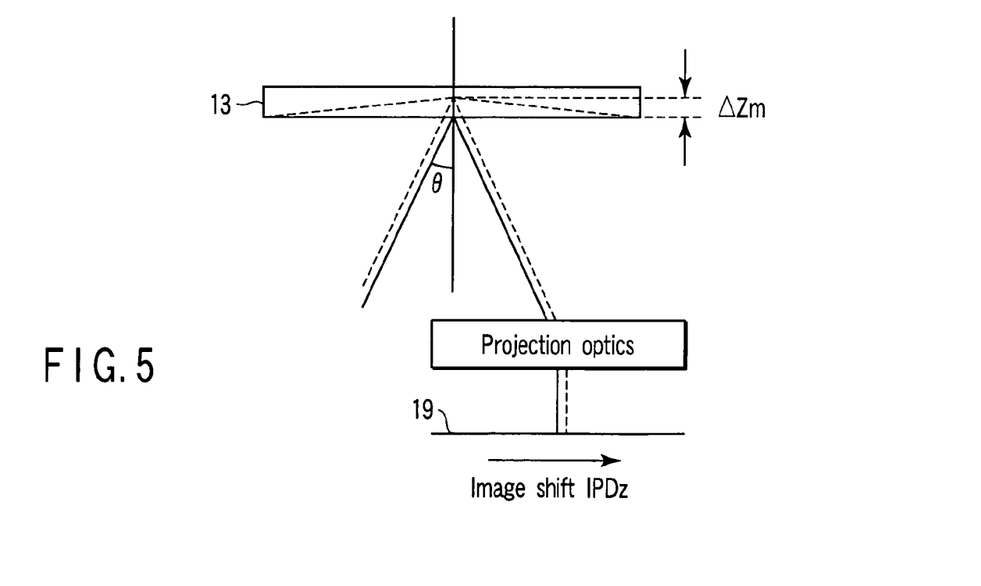
FIG. 5 is an explanatory view of a first example of an image shift attributed to a non-telecentric system.

As shown in FIG. 5, an irradiation position of the exposure light in a vertical direction on the mask shifts by the displacement of the Z direction, attributed to mask flatness (unevenness), in an oblique incidence system. Therefore, assuming that the angle of incidence of the exposure light upon the mask is θ, the plane of the mask is deformed and displaced in the Z-direction as shown by dotted lines in the figure, a displacement amount is ΔZm, and the reduction ratio of the projection optics is 1/M, the image shift (IPDz) in an image forming plane on the wafer is given by the following:

$$IPDz = (1/M) \times \tan\theta \times \Delta Zm \quad (1),$$

This image shift corresponds to a positional shift in the same direction as the direction of incidence of the exposure light. This IPDz denotes a displacement amount of a uniaxial direction, and displacement in a direction which agrees with the scanning direction.

Figure 6:
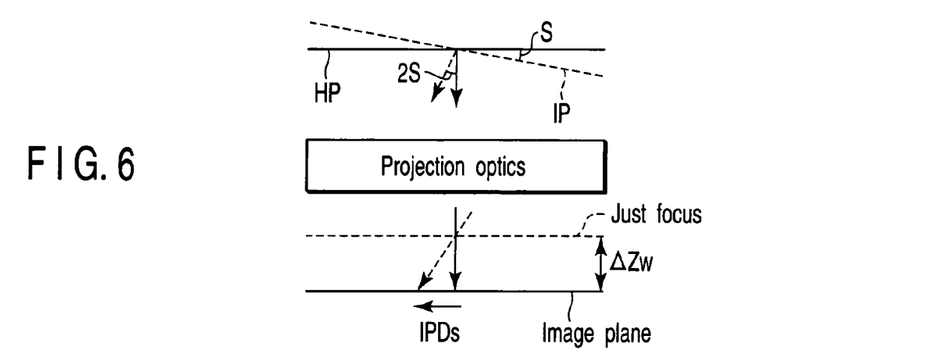
FIG. 6 is an explanatory view of a second example of the image shift attributed to the non-telecentric system.

Next, as shown in FIG. 6, when there is an inclined plane IP on the surface of the mask, the image shift occurs in a defocus state. This shift amount (IPDs) is given by the following equation, assuming that a slope (tilt angle) of the mask plane IP with respect to a horizontal plane HP is S, and a difference (defocus amount) between a just focus plane and an image plane is ΔZw.

$$IPDs = (2Sx \times (1/M) \times \Delta Zw(x, y), 2Sy \times (1/M) \times \Delta Zw(x, y)) \quad (2)$$

This image shift does not occur in principle, when the distance between the mask and the wafer is held to be constant, but this is not realistic, and a finite shift occurs.

Moreover, IPDs denote image shifts in x, y directions, and Sx, Sy denote gradients of the x and y directions in a coordinate position (x, y). A sign of the gradient Sy is defined as minus in a case where the mask surface tilts in a decreasing direction of the angle of incidence of the exposure light onto the tilt plane in the coordinate position (x, y). In this case, the image shifts in a direction opposite to the scanning direction. That is, the image shift direction is determined in accordance with a gradient direction.

Furthermore, ΔZw(x, y) is a defocus amount in arbitrary coordinates (x, y) on the wafer side, and strictly means the displacement amount of the vertical position in a point deviating from one plane in the irradiation region of the illuminative light of the scanner. When exposure is performed while performing a dynamic focus operation with the scanner, the exposure is performed in such a manner that an average distance between the mask front surface and wafer surface in the illuminative light region is kept to be constant. On an actual wafer surface local unevenness exists, so that there are points deviating from one plane in an irradiation light region of the scanner, which is a plane situated at a position where a distance between the above-described average mask surface and wafer surface is kept constant. The image shift occurs due to the vertical position displacement of the above deviating point. This image shift cannot be corrected even in an exposure system for dynamically controlling focus. Therefore, the image shift of the above equation (2) attributed to ΔZw(x, y) is produced.

Figure 7:
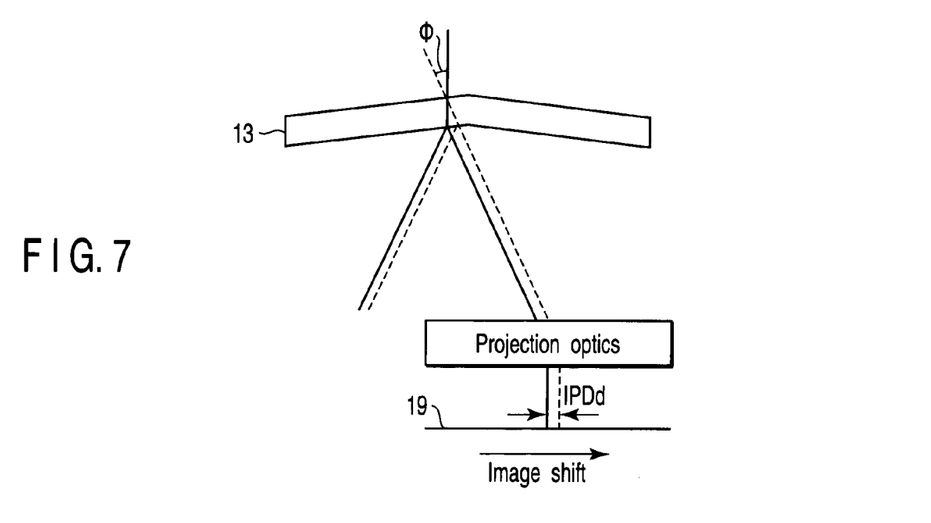
FIG. 7 is an explanatory view of a third example of the image shift attributed to the non-telecentric system.

Additionally, as shown in FIG. 7, a pattern position on the mask also shifts in a case where the mask substrate 13 is elastically deformed, and therefore the image shift (IPDd) occurs in the image plane. This equation is approximately as follows, assuming that an angle change in a normal direction by elastic deformation of the mounted mask surface is φ, and thickness of the mask is h:

$$IPDd = (1/M) \times h/2 \times \phi \quad (3),$$

wherein IPDd denotes a displacement amount of an uniaxial direction, and the image shift in a direction which agrees with the scanning direction.

Figure 8:
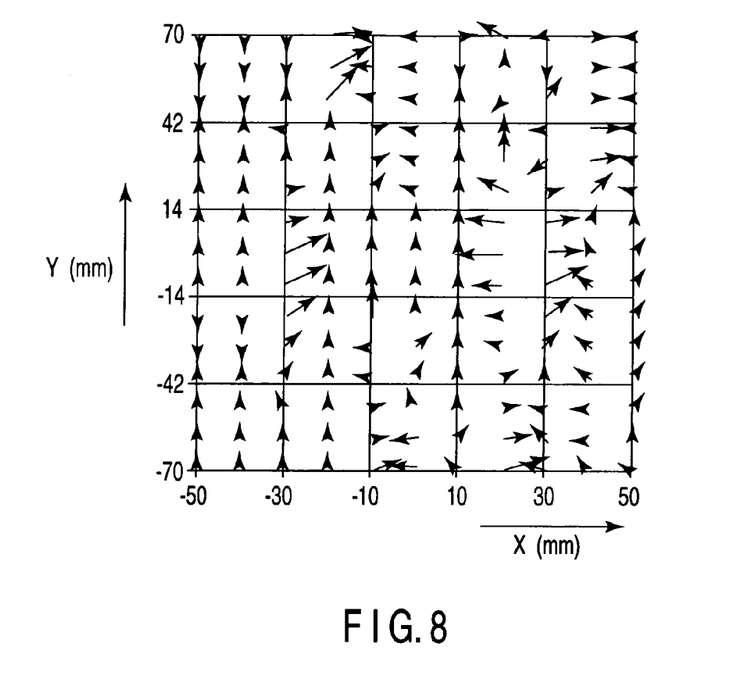
FIG. 8 is a diagram showing positional shift displacement in an XY horizontal plane of a wafer in vector.

Results of the image shifts calculated in this step ST105 are shown in FIG. 8. FIG. 8 is a vector diagram showing positional shift displacement in an XY horizontal plane of the wafer.

The writing data of the pattern is corrected based on the image position shift by various image shifts calculated in step ST105 in such a manner that the image position corresponds to a regular position, and first corrected pattern data is prepared (step ST106).

The image shifts are expressed by the equations (1) through (3) as described above, and the equations show the positional shifts on the image plane of the wafer. Needless to say, the correction of the mask writing data at step ST106 needs to be added with the reduction ratio of the projection optics. Therefore, the numerical value of the equations (1) through (3) multiplied by M should be used.

Figure 9:
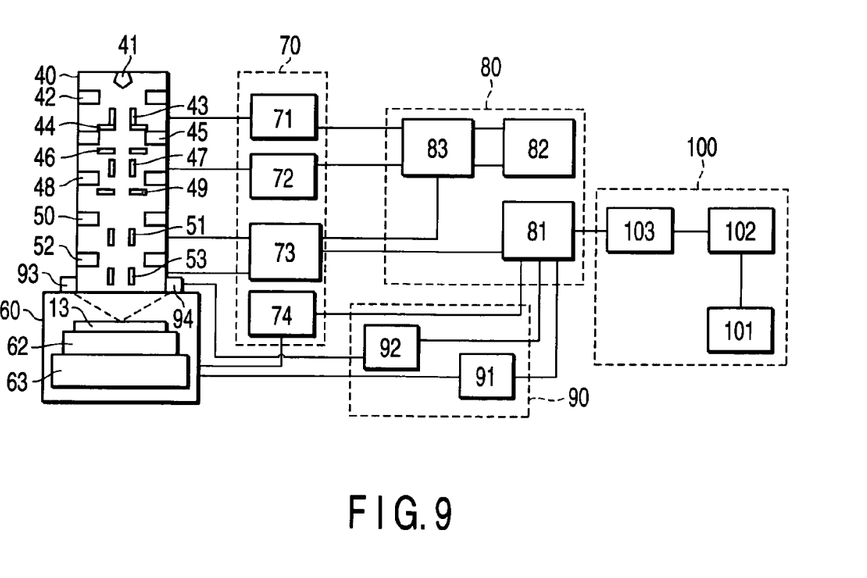
FIG. 9 is a diagram showing a variable shaping electron beam writing tool according to the first embodiment.

Next, the mask substrate shown in FIG. 9 is mounted on a variable shaping type electron beam writing tool (ST107).

FIG. 9 is a schematic constitution diagram showing a basic configuration of the variable shaping type electron beam writing tool according to a first embodiment of the present invention.

A main configuration includes an electron optical column 40, a writing chamber 60, a control system 70, a control computer system 80, a measuring system 90, and a data processing system 100. The electron optical column 40 comprises: an electron gun 41; a first lens 42; a blanking electrode (deflector) 43; a blanking aperture 44; a second lens 45; a first shaping aperture 46; a shaping deflector 47; a third lens 48; a second shaping aperture 49; a fourth lens 50; a main deflector 51; a second lens 52; and a sub-deflector 53.

A writing stage 62 on which the mask substrate 13 to be written is to be mounted is contained in the writing chamber 60, and the writing stage 62 is driven by a stage driving mechanism 63. The position of the stage 62 is measured by a laser interferometer 91, and fed back to a stage driver 74 to thereby control the stage position. The control system 70 includes a blanking controller 71, a variable shaped beam size controller 72, a deflection controller 73, and the stage driver 74. The control computer system 80 includes a control computer 81, a buffer memory 82, and a control circuit 83. In addition to the above-described laser interferometer 91, the measuring system 90 includes a vertical position measuring tool 92 constituted of vertical position sensors 93, 94, and a measuring system (not shown) concerning a beam current, temperature, and vacuum. The data processing system 100 comprises a CAD system 101, an arithmetical processor 102, and a data converter 103.

Design data (CAD data) is input into the CAD system 101, subjected to predetermined processes such as proximity effect correction and figure partitioning in the arithmetical processor 102, and converted into machine data in the data converter 103. The arithmetical processor 102 is provided with a buffer memory which is a function of temporarily storing calculation results. In the figure partitioning process, the design data is successively generated, read, and transferred to a figure partitioning circuit in the arithmetical processor 102. In the figure partitioning, a coordinate position, size, and irradiation time of each divided shot are set, writing conditions including them are prepared as data, and the data is temporarily stored in a memory contained in the data converter 103. Furthermore, shaping deflection data is also prepared in such a manner as to shape the shot in accordance with the shape or size of a figure to be written.

The writing data converted into the machine data has a data structure in which the data is divided for each striped frame (main deflection region), and further divided into sub-deflection region units. This machine data is transmitted to the control computer system 80, and the blanking controller 71, variable shaped beam size controller 72, deflection controller 73, and writing stage driver 74 are controlled by the control computer 81, buffer memory 82, and control circuit 83.

The electron beam emitted from the electron gun 41 is controlled to turn on/off by the blanking electrode 43, and the irradiation amount at a writing time is set. The blanking electrode 43 is positioned in the most vicinity of the electron gun 41 in various deflectors, and connected to the blanking controller 71. Moreover, the beam passed through the blanking aperture 44 is formed into predetermined shapes and sizes by the shaping deflector 47 connected to the variable shaped beam size controller 72, and the shaping apertures 46, 49 positioned below. This shaped beam is scanned on the blank mask substrate 13 by the main deflector 51 and sub-deflector 53 connected to the deflection controller 73, and accordingly subjected to desired writing. It is to be noted that as to a beam output, a beam current density is appropriately measured by a Faraday cup attached to a part of the writing stage 62, and fed back to the control circuit of the electron gun 41 so that stabilization is strictly maintained (not shown).

Prior to the writing, geometric positional shift of the focal position of the beam, accompanying deviation from a reference vertical position, needs to be corrected in accordance with the surface unevenness of the blank mask substrate 13 in performing the writing, and the vertical position of the surface of the blank mask substrate 13 is measured. The positional shift produced by expansion/contraction of the substrate accompanying the elastic deformation of the substrate, which caused by mask holding, needs to be corrected in writing the pattern, and the vertical position of the surface of the blank mask substrate 13 is similarly measured.

The measuring is performed while changing the position of the writing stage 62 through the vertical position sensors 93, 94 and the measuring tool 92, and data of a vertical position distribution of the substrate surface is obtained. A deflection correction amount is calculated based on the substrate vertical position profile in the control computer 81, each deflector is controlled together with another deflection amount, and the beam is accordingly applied to an appropriate position. Thus, the writing is realized with a desired positional precision.

Next, the vertical position profile of the blank mask substrate at a time when the blank mask substrate is mounted on the writing stage of the pattern writing tool is obtained (step ST108). Prior to the writing, while driving the writing stage, the blank mask substrate surface is successively measured in a grid shape using the vertical position sensor disposed on the writing tool, and the vertical position data of the respective grid points from a reference plane is obtained. However, as aforementioned, the measurement does not need to be performed in a grid shape.

Second corrected writing data is prepared for correcting the positional shift attributed to a difference of the substrate surface shape at the mounting between the exposure tool and the writing tool based on the data obtained in steps ST108 and ST102 in performing the writing (step ST109). The control computer 81 determines the deflection correction amount based on the vertical position profile of the blank mask substrate 13. Correction data is prepared which corrects the geometric positional shift of the focal position of the beam, produced in accordance with the unevenness of the blank mask substrate surface.

The pattern is written based on the first corrected writing pattern data prepared in step ST106 and the second corrected writing pattern data obtained in step ST109 (step ST110). Here, various correction writing which has heretofore been performed, such as proximity effect correction, loading effect correction, and resizing, frame shifting multiphase printing, shot multiphase printing and the like are performed based on the original processing of the writing data. Through this process, it is possible to prepare a non-telecentric exposure reflective mask capable of realizing sufficient transfer position precision.

It is to be noted that when the unevenness of the mask substrate or the local curved surface gradient are calculated from the vertical position profile of the mask substrate surface in the process of step ST104, data of the respective points of measurement grid is interpolated to thereby obtain a curved surface approximate equation, and it is possible to calculate the vertical position and gradient in the arbitrary coordinate position (x, y) based on the equation. It is possible to use spline interpolation which is generally performed, but a data interpolation system at calculation is preferably determined in accordance with the size of the coordinate grid of the correction writing. In the present embodiment, by application of surface interpolation by quartic multinomial, higher-precision correction data can be produced.

Figure 10:
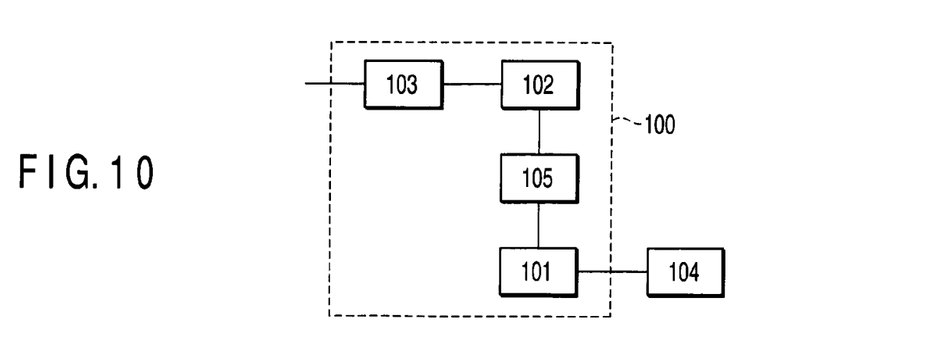
FIG. 10 is a block diagram showing a data processing system of the writing tool shown in FIG. 9.

FIG. 10 shows the data processing system in the writing tool in performing a process flow of FIG. 9 in the present invention. An external data interface 104 and an arithmetical circuit 105 are added to the data processing system 100 in FIG. 9. The system is constituted in such a manner that vertical position data of the mask substrate in a blank state at the mounting on the exposure tool in step ST102 is taken through the external data interface 104, and the parameter concerning the exposure tool in step ST103 is set. The arithmetical circuit 105 executes respective steps ST107 to ST110 by the vertical position data of the mask substrate and the exposure tool parameters together with the design pattern data input into the CAD system 101. By these processes, the coordinate correction data is produced for correcting the positional shift of the transfer pattern, caused by the elastic deformation of the mask substrate, and the exposure optics. Subsequently, the writing is performed by a usual process. Another tool constitution is similar to that of FIG. 9. It is to be noted that step ST102 is executed by a console in the non-telecentric exposure tool, and the obtained vertical position data of the mask substrate is stored in a data memory portion. The data is input through the external data interface 104 via a network or a storage medium.

In other words, the process flow of the present embodiment is a process to deform absolute grid coordinates into optimum grid shapes in accordance with the positional shift calculated based on the vertical position data of the mask substrate at the mounting on the exposure tool. Accordingly, the pattern positional shift by the shift of the transferred image in the exposure tool is corrected, and high position precision can be achieved.

Figure 3:
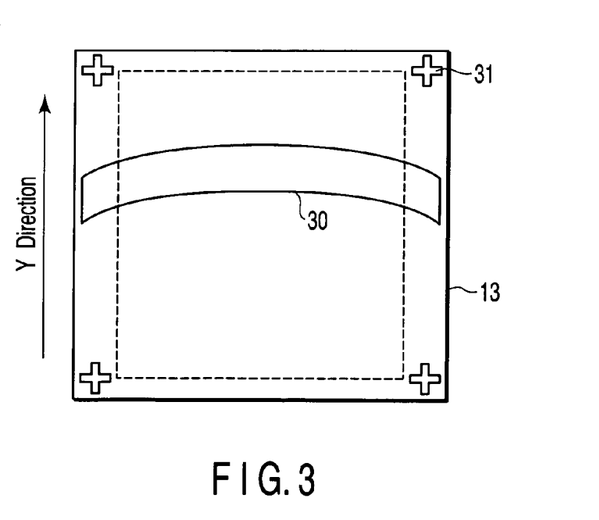
FIG. 3 is an explanatory view of an irradiation region according to the first embodiment.

It is to be noted that, as shown in FIG. 3, the fiducial mark is formed beforehand on the blank mask used in the present embodiment, and the blank substrate is defined in the sense that any circuit pattern is not formed on the substrate itself. The mask is positioned and held on the mask stage based on the fiducial mark. Accordingly, reproducibility of the appearing mask surface shape when the mask is mounted on the mask stage is remarkably enhanced. Therefore, when the final pattern formed mask is mounted on the mask stage and exposed, sufficient precision is secured by the correction writing by the process flow of the present embodiment. Additionally, mechanical conveying precision is about several tens of micrometers when the mask is mounted on the mask stage, and therefore the precision is secured even in a case where the mask is held without using any mark.

Second Embodiment

Figure 11:
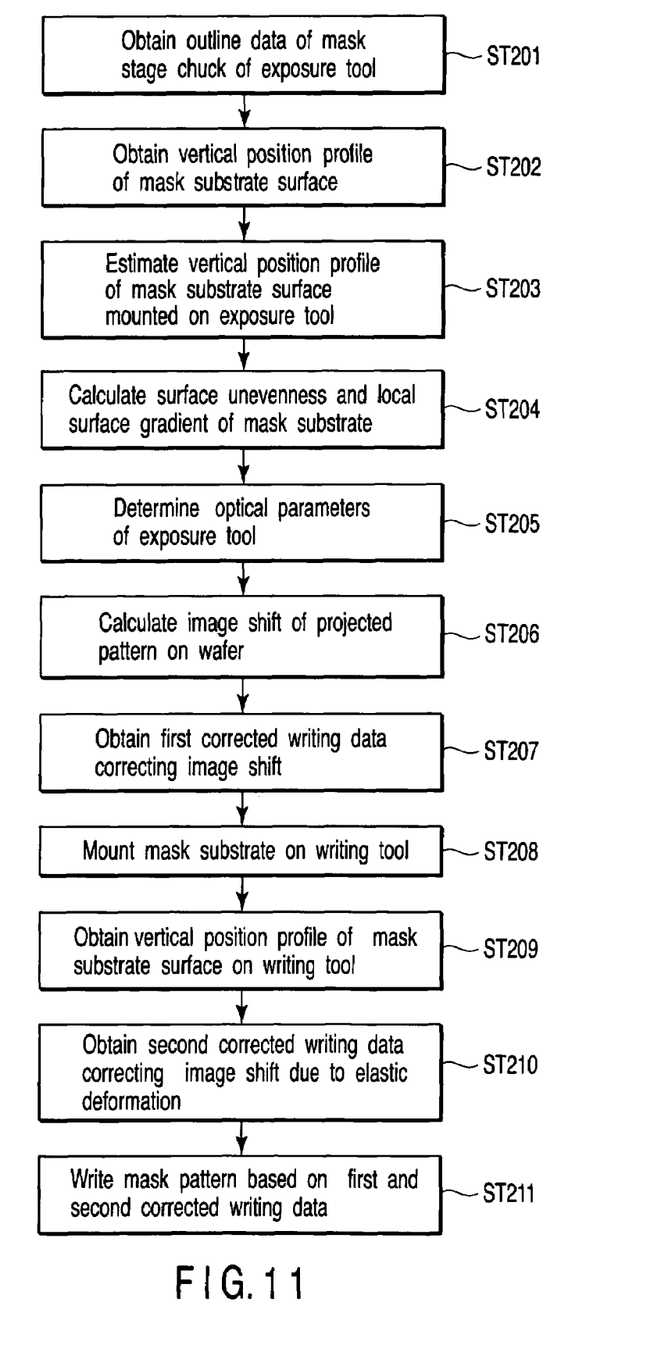
FIG. 11 is a flowchart showing a writing method according to a second embodiment.

FIG. 11 is a flowchart showing a writing method according to a second embodiment of the present invention.

In the present embodiment, even in a case where a mask substrate is not mounted on an exposure tool, surface unevenness of a mask at a time when the mask is mounted on the mask stage is predicted based on data of a mask stage surface shape and the shape of each blank mask which are measured (or inspected) beforehand, and a subsequent writing process is performed. In this case, since the substrate is not measured using the actual exposure tool, the exposure tool is not occupied for obtaining the mask surface shape, and there is no fear that productivity in an exposure step is degraded.

First, outline data of a mask stage chuck of the exposure tool is obtained (step ST201). As the chuck of the mask stage in step ST201, a flat or pin type electrostatic chuck, three-point supported electrostatic chuck, or four-point supported electrostatic chuck may be applied.

A vertical position profile of front/back surface of the mask substrate is obtained (step ST202). In steps ST201, ST202, flatness measurement by an oblique incidence interferometer or Fizeau interferometer is possible. Additionally, when high-precision measuring is performed, influence of gravity, atmosphere, temperature and the like need to be sufficiently managed.

The vertical position profile of the mask substrate surface at a time when the mask substrate is mounted on the exposure tool is estimated from the outline data of the mask stage and the vertical position profile of the front/back surface of the mask substrate (step ST203). To perform the estimating, elastic deformation of the mask substrate mounted on the mask stage is analyzed by the technique of the material mechanics. Accordingly, estimation is performed by adding the surface shapes of the mask stage and the front and back surfaces of the blank mask substrate. Therefore the surface shape of the mask after mounted on the mask stage is predicted.

The unevenness of the mask substrate surface and, if necessary, local surface gradient are calculated from the vertical position profile of the mask substrate surface obtained in step ST203 (step ST204). Here, the calculation is performed with respect to the mask surface unevenness data obtained in step ST203 using the vertical position of the substrate in positions where a plurality of fine alignment marks for use in aligning between the mask pattern position and each chip position in a wafer are to be disposed in the blank mask substrate as a reference. That is, the reference plane corresponds to a virtual plane which is formed by each vertical position of the mask surface in the position where the fine alignment marks are to be disposed under the condition that the mask is mounted on the exposure tool. The surface shape of the mask after mounted on the mask stage is based on data of an unevenness amount in a mask deviating from the reference plane.

Subsequent steps of and after step ST205 are similar to those described in the first embodiment. Through the above-described flow processes, it is possible to prepare a non-telecentric exposure reflective mask capable of realizing sufficient transfer position precision.

It is to be noted that the present invention is not limited to the above-described embodiments. It is possible to apply a partially combined embodiment. In the above embodiments, the variable shaping type electron beam writing tool has been described as an example, but, needless to say, the present invention can be applied to a character projection type electron beam writing tool. The present invention can be applied to writing tools using not only an electron beam but also a charged particle beam such as an ion beam, an electromagnetic beam, or a laser beam.

Moreover, in the embodiments, the arithmetical circuit in the tool configuration has been used in performing a series of calculation processes, but the processes do not have to be necessarily executed by the constituting element of the tool. When similar processes are performed using an arithmetical circuit or a computer disposed externally, there is a merit that necessary writing data can be prepared without occupying the writing tool main body.

Additionally, as the chuck of the mask stage of the exposure tool, it is possible to use a flat type chuck, three-point supported type electrostatic chuck, or mechanical clamp type chuck.

Moreover, the blank mask substrate does not completely mean a blank, and as described in the embodiments, a fiducial mark for positioning or vertically positioning may be formed. Especially, to prepare a mask having a phase shifting structure, such as the Levenson type (attenuating type), a circuit pattern of a first layer is formed beforehand, and next a pattern of a second layer is formed in accordance with the pattern of the first layer. Even in a case where the circuit pattern is formed beforehand on the blank substrate in this manner, the present invention is applicable. In this case, the fine alignment mark is often already formed on the first layer of the mask, and the vertical position can be measured using the fine alignment mark as the reference.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of generating writing pattern data of a reflective mask for use in a non-telecentric reflective exposure tool, comprising:
    obtaining a vertical position profile by measuring vertical positions of a plurality of X, Y coordinates arbitrarily set on the surface of a blank mask substrate when mounted on a mask stage of the reflective exposure tool, or by measuring and calculating a flatness profile of the surface of the blank mask;
    calculating unevenness and a local curved surface gradient of the blank mask substrate surface from the vertical position profile;
    calculating a shift amount of an image position of a pattern corresponding to the writing pattern data which is transferred by the reflective exposure tool, generated in a wafer substrate to be processed, mounted on a wafer stage of the reflective exposure tool, in accordance with the unevenness and local curved surface gradient of the blank mask substrate and parameters of a non-telecentric optics of the reflective exposure tool; and
    obtaining first corrected writing pattern data by correcting design pattern data of the reflective mask based on the shift amount of the image position and a reduction ratio of a projection optics of the reflective exposure tool.

2. The method according to claim 1, wherein the obtaining of the vertical position profile includes measuring the vertical position of the blank mask substrate surface in a state in which the blank mask substrate is disposed on a mask stage of the reflective exposure tool toward an incidence side of an illumination optics of the reflective exposure tool, or obtaining the vertical position profile by estimating calculation by adding shapes of the mask stage of the reflective exposure tool and front and back surfaces of the blank mask substrate.

3. The method according to claim 1, wherein the calculating of the unevenness of the blank mask substrate surface includes calculating a curved surface approximate equation by interpolating data of the plurality of X, Y coordinates, or calculating the vertical position of the x, y coordinates using spline interpolation.

4. The method according to claim 1, wherein the calculating of the shift amount of the image position includes calculating an image shift $(1/M) \times \tan\theta \times \Delta Zm$ in an image plane on the wafer substrate, where an angle of incidence of exposure light is $\theta$, a displacement amount of a plane of the mask in a z direction is $\Delta Zm$, and a reduction ratio of projection optics is $1/M$.

5. The method according to claim 1, wherein the calculating of the shift amount of the image position includes calculating an image shift $((1/M) \times (h/2) \times \Phi)$, where an angle change in a normal direction by elastic deformation of a mask plane is $\Phi$, and a thickness of the mask is h.

6. The method according to claim 1, wherein the calculating of the shift amount of the image position includes:
    calculating an image shift $(1/M) \times \tan\theta \times \Delta Zm$ in an image plane on the wafer substrate, where an angle of incidence of exposure light is $\theta$, a displacement amount of a plane of the mask in a z direction is $\Delta Zm$ and a reduction ratio of projection optics is $1/M$; and
    calculating an image shift $((1/M) \times (h/2) \times \Phi)$, where an angle change in a normal direction by elastic deformation of a mask plane is $\Phi$, and a thickness of the mask is h.

7. The method according to claim 1, wherein the calculating of the shift amount of the image position includes calculating the shift amount of the image position based on a function of two physical amounts including displacement of the vertical position from a reference position in each of the plurality of X, Y coordinates of the blank mask substrate, and an angle of incidence of exposure light of the reflective exposure tool upon the reference position.

8. The method according to claim 1, wherein the calculating of the shift amount of the image position includes:
    obtaining a reference plane including the vertical position of the blank mask substrate in positions where a plurality of fine alignment marks for use in aligning between the mask pattern position and each chip position in the wafer substrate to be processed are to be disposed; and
    obtaining the unevenness of the blank mask substrate with respect to the plurality of X, Y coordinates based on the reference plane.

9. The method according to claim 1, wherein exposure light and the substrate to be processed are scanned with respect to the blank mask substrate in the reflective exposure tool, and
    the parameter of the non-telecentric optics includes at least one selected from the group consisting of an angle of incidence and a direction of incidence of the exposure light of the reflective exposure tool with respect to the blank mask substrate, a scanning direction of the exposure light with respect to the blank mask substrate, a scanning direction of the substrate to be processed with respect to the blank mask substrate, and exposure magnification.

10. A method of writing a reflective mask, comprising:
    generating the first corrected writing pattern data from the design pattern data using the method of generating the writing pattern data according to claim 1;
    preparing a pattern writing tool which writes a mask pattern of a semiconductor circuit by a charged particle beam, an electron beam, or light;
    disposing the blank mask substrate on a mask stage in the pattern writing tool;
    preparing second corrected writing pattern data by correcting a positional shift attributed to a substrate surface shape change between the reflective exposure tool and the writing tool; and
    writing the mask pattern on the blank mask substrate using the first and second corrected writing pattern data by the pattern writing tool.

11. A method of generating writing pattern data of a reflective mask for use in a non-telecentric reflective exposure tool, comprising:
    obtaining a vertical position profile by measuring or calculating vertical positions of a plurality of X, Y coordinates arbitrarily set on a surface of a blank mask substrate;

calculating unevenness and a local curved surface gradient of the blank mask substrate surface from the vertical position profile;

calculating a shift amount of an image position of a pattern corresponding to the writing pattern data, generated in a wafer substrate to be processed, mounted on a wafer stage of the reflective exposure tool, in accordance with the unevenness and the local curved surface gradient of the blank mask substrate and a parameter of a non-telecentric optics of the reflective exposure tool; and obtaining first corrected writing pattern data by correcting design pattern data of the reflective mask based on the shift amount of the image position and a reduction ratio of projection optics of the reflective exposure tool.

12. The method according to claim 11, wherein the obtaining of the vertical position profile includes measuring the vertical position of the blank mask substrate surface in a state in which the blank mask substrate is disposed on a mask stage of the reflective exposure tool toward an incidence side of an illumination optics of the reflective exposure tool, or obtaining the vertical position profile by estimating calculation by adding a surface shape of the mask stage of the reflective exposure tool and front and back surfaces of the blank mask substrate.

13. The method according to claim 11, wherein the calculating of the unevenness and the local surface gradient of the blank mask substrate surface includes calculating a curved surface approximate equation by interpolating data of the plurality of X, Y coordinates, or calculating the vertical position of the plurality of X, Y coordinates, and the gradient using spline interpolation.

14. The method according to claim 11, wherein the calculating of the shift amount of the image position includes calculating an image shift $(1/M) \times \tan \theta \times \Delta Zm$ in an image plane on the wafer substrate, where an angle of incidence of exposure light is $\theta$, a displacement amount of a plane of the mask in a z direction is $\Delta Zm$, and a reduction ratio of projection optics is $1/M$, and calculating an image shift $(2S \times (1/M) \times \Delta Zw)$ in the image plane on the wafer substrate, where a local slope of the mask plane mounted on a mask stage of the reflective exposure tool is S, and defocus amount of the image plane is $\Delta Zw$.

15. The method according to claim 11, wherein the calculating of the shift amount of the image position includes calculating an image shift $((1/M) \times (h/2) \times \Phi)$, where an angle change in a normal direction by elastic deformation of a mask plane is $\Phi$ and a thickness of the mask is h.

16. The method according to claim 11, wherein the calculating of the shift amount of the image position includes calculating an image shift $(1/M) \times \tan \theta \times \Delta Zm$ in an image plane on the wafer substrate, where an angle of incidence of exposure light is $\theta$, and a displacement amount of a plane of the mask in a z direction is $\Delta Zm$, and a reduction ratio of projection optics is $1/M$, calculating an image shift $(2S \times (1/M) \times \Delta Zw)$, where a local slope of the mask plane mounted on a mask stage of the exposure tool is S, and a defocus amount of an image plane is $\Delta Zw$, and calculating an image shift $((1/M) \times (h/2) \times \Phi)$ in the image plane on the wafer substrate, where an angle change in a normal direction by elastic deformation of a mask plane is $\Phi$, and a thickness of the mask is h.

17. The method according to claim 11, wherein the calculating of the shift amount of the image position includes calculating the shift amount of the image position based on a function of two physical amounts including displacement of the vertical position from a reference position in each of the plurality of X, Y coordinates of the blank mask substrate, and an angle of incidence of exposure light of the reflective exposure tool upon the reference position.

18. The method according to claim 11, wherein the calculating of the shift amount of the image position includes:

obtaining a reference plane including the vertical position of the blank mask substrate in positions where a plurality of fine alignment marks for use in aligning between the mask pattern position and each chip position in the wafer substrate to be processed are to be disposed; and obtaining the unevenness and the local surface gradient of the plurality of X, Y coordinates of the blank mask substrate based on the reference plane.

19. The method according to claim 11, wherein exposure light and the wafer substrate to be processed are scanned with respect to the blank mask substrate in the reflective exposure tool, and the parameter of the non-telecentric optics includes at least one selected from the group consisting of an angle of incidence and a direction of incidence of the exposure light of the reflective exposure tool with respect to the plurality of X, Y coordinates of the blank mask substrate, a scanning direction of the exposure light with respect to the blank mask substrate, a scanning direction of the wafer substrate to be processed with respect to the blank mask substrate, and exposure magnification.

20. A method of writing a reflective mask, comprising:

generating the first corrected writing pattern data from the design pattern data using the method of generating the writing pattern data according to claim 11;

preparing a pattern writing tool which writes a mask pattern of a semiconductor circuit by a charged particle beam, an electron beam, or light;

disposing the blank mask substrate on a mask stage in the pattern writing tool;

preparing second corrected writing pattern data by correcting a positional shift attributed to a substrate surface shape change between the reflective exposure tool and the writing tool; and writing the mask pattern on the blank mask substrate using the first and second corrected writing pattern data by the pattern writing tool.

21. The method according to claim 1, wherein calculating a shift amount of an image position comprises calculating a shift amount due to elastic deformation of the blank mask substrate when mounted on the mask stage.

22. The method according to claim 11, wherein calculating a shift amount of an image position comprises calculating a shift amount due to elastic deformation of the blank mask substrate when mounted on the mask stage.

* * * * *

UNITED STATES PATENT AND TRADEMARK OFFICE
CERTIFICATE OF CORRECTION

| | | |
|---|---|---|
| PATENT NO. | : 7,704,645 B2 | Page 1 of 1 |
| APPLICATION NO. | : 11/068904 | |
| DATED | : April 27, 2010 | |
| INVENTOR(S) | : Mitsui | |

It is certified that error appears in the above-identified patent and that said Letters Patent is hereby corrected as shown below:

Claim 15, column 13, line 48, change "Φand" to --Φ, and--.

Signed and Sealed this

Twenty-ninth Day of June, 2010

David J. Kappos
*Director of the United States Patent and Trademark Office*